United States Patent [19]

Ozaki et al.

[11] Patent Number: 4,763,182
[45] Date of Patent: Aug. 9, 1988

[54] SEMICONDUCTOR MEMORY DEVICE WITH DEEP BIT-LINE CHANNEL STOPPER

[75] Inventors: Hiroji Ozaki; Shinichi Sato; Akira Tokui; Akira Kawai; Masayuki Nakajima; Masao Nagatomo, all of Hyogo, Japan

[73] Assignee: Mitsubishi Denki Kabushiki Kaisha, Tokyo, Japan

[21] Appl. No.: 941,216

[22] Filed: Dec. 12, 1986

[30] Foreign Application Priority Data

Dec. 16, 1985 [JP] Japan .................. 60-284627

[51] Int. Cl.[4] .......................... H01L 29/78
[52] U.S. Cl. .................. 357/23.6; 357/14; 357/52; 357/89; 357/91
[58] Field of Search .......... 357/23.6, 90, 89, 52, 357/91, 13, 14 ; 365/149

[56] References Cited

U.S. PATENT DOCUMENTS

| | | | |
|---|---|---|---|
| 4,164,751 | 8/1979 | Tasch | 357/23.6 |
| 4,247,862 | 1/1981 | Klein | 357/90 |
| 4,377,756 | 3/1983 | Yoshihara et al. | 357/23.6 |
| 4,467,450 | 8/1984 | Kuo | 357/23.6 |
| 4,688,064 | 8/1987 | Ogura et al. | 357/23.6 |

FOREIGN PATENT DOCUMENTS 55-158659  12/1980  Japan .

*Primary Examiner*—Joseph E. Clawson, Jr.
*Attorney, Agent, or Firm*—Lowe, Price, LeBlanc, Becker & Shur

[57] ABSTRACT

A semiconductor memory device comprises a first conductivity type semiconductor substrate (1) formed thereon with a charge storage region (5) and a second conductivity type region (6) serving as a bit line, and first conductivity type highly concentrated regions (8, 11) higher in concentration than the semiconductor substrate (1) at least by one digit are formed to enclose the charge storage region (5) and the bit line region (6) respectively. Thus, potential barriers against electrons can be defined in interfaces between the highly concentrated region (8) and the charge storage region (5) and between the highly concentrated region (11) and the bit line region (6), thereby to prevent malfunction caused by incidence of radioactive rays such as alpha rays.

2 Claims, 2 Drawing Sheets

SEMICONDUCTOR MEMORY DEVICE WITH DEEP BIT-LINE CHANNEL STOPPER

BACKGROUND OF THE INVENTION

1. Field of the Invention

The present invention relates to a semiconductor memory device for storing charges as information.

2. Description of the Prior Art

FIG. 2 shows memory cell structure of a 256K dynamic RAM as an example of a conventional semiconductor memory of the aforementioned type. Referring to FIG. 2, numeral 1 indicates a P− type (first conductivity type) semiconductor substrate, numerals 2 and 3 indicate first and second gate electrodes, numeral 4 indicates a gate insulator film, numeral 5 indicates an N+ type (second conductivity type) region serving as a charge storage region, numeral 6 indicates an N+ type (second conductivity type) region serving as a bit line, numeral 7 indicates a depletion layer, numeral 8 indicates a P+ type region which is made higher in concentration than the semiconductor substrate 1 at least by one digit to expand the memory cell capacity, numeral 9 indicates a P+ type isolation (channel stop) region and numeral 10 indicates an insulator film for isolating the elements. A wiring part and a protective coat are omitted in FIG. 2.

In the conventional memory cell as shown in FIG. 2, the P+ type region 8 is formed in the periphery of the N+ type region 5 serving as the charge storage region to expand the memory cell capacity thereby to increase the critical charge amount, for preventing soft errors so that no malfunction occurs even if the charge storage region 5 collects electrons generated by radioactive rays such as alpha rays.

However, the N+ type region 6 serving as the bit line is not protected against attraction of the electrons. Further, when the wafer is inclined by several degrees (7° to 8°) for ion implantation to additionally implant P type impurities in the periphery of the N+ type region 6, lateral impurity diffusion is increased by collision with Si lattices, whereby a parasitic PNP transistor is operated. Thus, it has been difficult to stably drive a pass transistor.

In general, the conventional semiconductor memory device has no barrier for collecting the electrons generated by the alpha rays in the N+ type region 6, whereby soft errors are easily caused. Further, since the wafer is inclined for ion implantation, ion-implanted layers such as source and drain regions to be formed in a self-alignment manner may be blocked by masks such that ion implantation cannot be performed as designed, to cause trouble in a highly integrated circuit.

SUMMARY OF THE INVENTION

The present invention has been proposed in consideration of the aforementioned problems, and the object thereof is to provide a semiconductor memory device of refined structure which can simply prevent soft errors caused by radioactive rays such as alpha rays without degrading transistor characteristics.

In order to attain the said object, a semiconductor memory device according to the present invention is provided with first conductivity type highly concentrated regions having deep junction formed to enclose second conductivity type regions such that the highly concentrated regions are higher in concentration than a first conductivity type semiconductor substrate at least by one digit.

According to the present invention, the semiconductor memory device is prevented from malfunction caused by incidence of radioactive rays such as alpha rays.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
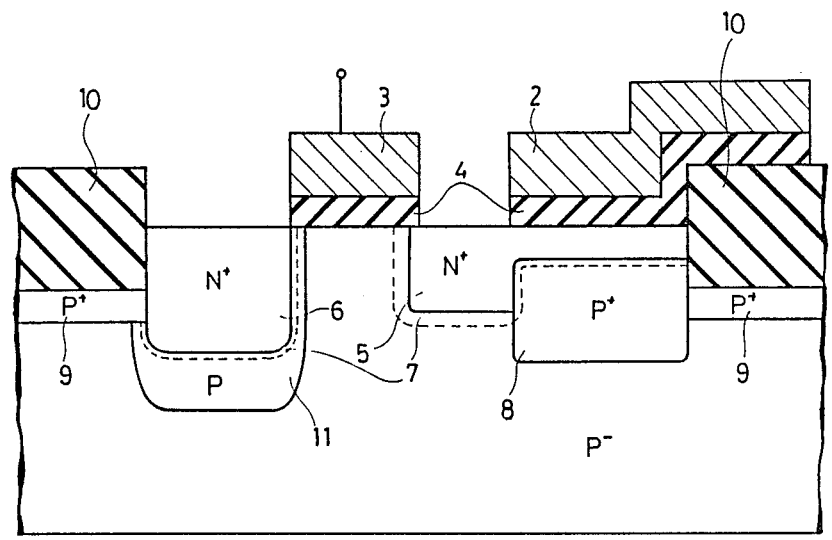
FIG. 1 is a sectional view showing a semiconductor memory device according to an embodiment of the present invention.
Figure 2:
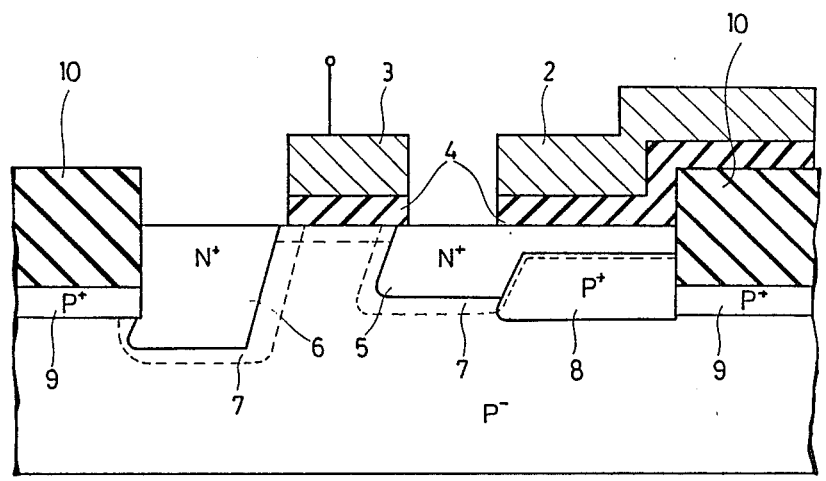
FIG. 2 is a sectional view showing a conventional semiconductor memory device.

FIG. 1 shows a semiconductor memory device according to an embodiment of the present invention. Referring to FIG. 1, numeral 11 indicates a P+ type region formed as a highly concentrated region under an N+ type region 6. Numeral 1 indicates a P− type (first conductivity type) semiconductor substrate, numerals 2 and 3 indicate first and second gate electrodes, numeral 4 indicates a gate insulator film, numeral 5 indicates an N+ type (second conductivity type) region serving as a charge storage region, numeral 6 indicates an N+ type (second conductivity type) region serving as a bit line, numeral 7 indicates a depletion layer, numeral 8 indicates a P+ type region which is made higher in concentration than the semiconductor substrate 1 at least by one digit to expand the memory cell capacity, numeral 9 indicates a P+ type isolation (channel stop) region and numeral 10 indicates an insulator film for isolating the elements. A wiring part and a protective coat are omitted in FIG. 1.

The P+ type regions 8 and 11 are formed by ion implantation of B or $BF_2$ under the N+ type regions 5 and 6 respectively at low energy at an injection angle of 0° C. to the normal line of the substrate surface. Such ion implantation is performed with the wafer plane being perpendicular to the direction of implanted ions, thereby to provide deep junction at low energy. The P+ type regions 8 and 11 are at least ten times higher in concentration than that of semiconductor substrate 1. For example, the concentration range of the P+ type regions 8 and 11 is set at $10^{14}$ to $10^{18}/cm^3$ with respect to the concentration range of $10^{13}$ to $10^{16}/cm^3$ of the semiconductor substrate 1. The P+ type regions 8 and 11 are thus formed to prevent spreading of the depletion layer 7, save the memory cell capacity of the N+ type region 5, provide a margin for the capacity and define barriers against electrons generated by alpha rays. Namely, the electrons diffused from the P− type semiconductor substrate 1 are recombined in the P+ type regions 8 and 11 not to reach the N+ type regions 5 and 6. Thus, potential barriers against the electrons are defined in the interfaces between the P+ type regions 8 and 11 and the N+ type regions 5 and 6, thereby to prevent soft errors.

In the aforementioned embodiment, the charge storage region and the bit line of the semiconductor memory device are formed by the N+ type regions 5 and 6 respectively. This also applies to N+ type regions of a sense amplifier and peripheral circuits of the semiconductor memory device. Although the aforementioned embodiment is applied to a dynamic RAM, the present invention is also applicable to a static RAM. Further, in case where N channels are replaced by P channels, the present invention can be applied by merely changing the ions. In addition, the present invention is applicable not only to a MOS device, but also to a bipolar device.

Due to application of the present invention, the chip itself can be resistant against soft errors, and hence there is no need to employ an alpha particle prevention film and specific package material.

Figure 3:
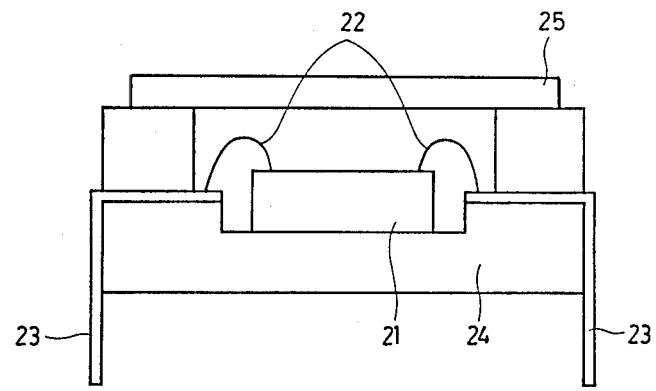
FIGS. 3 to 5 are schematic diagrams showing examples of packages containing memory cells of semiconductor memory device according to the present invention.
Figure 4:
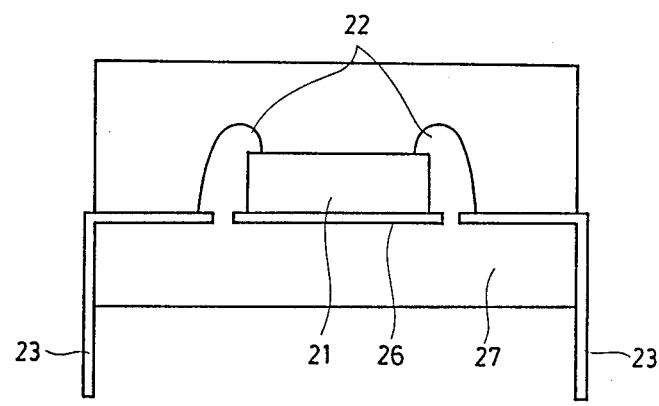
Figure 5:
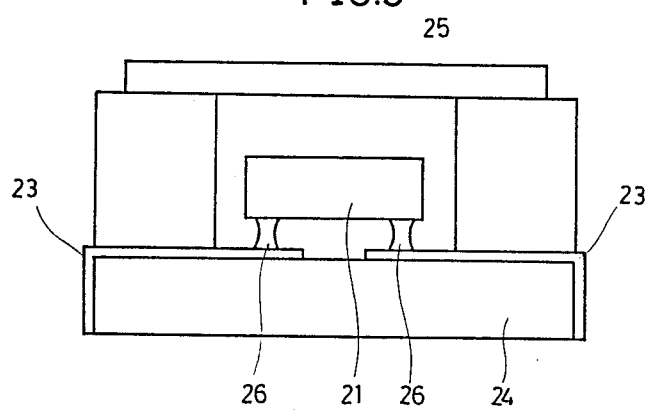

FIGS. 3 to 5 illustrate examples of packages containing memory cells to which the present invention is applied. The packages as shown in FIGS. 3 to 5 are formed by well-known materials, which are not required to be low in alpha particle emission rate. Further, no alpha particle prevention films are required on the chip surfaces.

FIG. 3 shows a ceramic package, FIG. 4 shows a resin-molded package and FIG. 5 shows a flip chip type package. Referring to FIGS. 3 to 5, numeral 21 indicates memory chips, numeral 22 indicates bonding wires, numeral 23 indicates external lead wires, numeral 24 indicates ceramic substrates, numeral 25 indicates lids, numeral 26 indicates frames and numeral 27 indicates a resin member. Although not shown in the drawings, the present invention can also be applied to SOF, ZIP and module type packages so that no alpha particle prevention films are required on the chip surfaces with specific package materials, thereby to decrease manufacturing steps and reduce the manufacturing cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a first conductivity type semiconductor substrate formed thereon with a second conductivity type charge storage region, a second conductivity type region service as a bit line, and first and second gate electrodes on a surface thereof, said device further comprising first conductivity type highly concentrated regions having deep junctions disposed between a portion of said second conductivity type charge storage region said substrate and separating said bit line region and said substrate, said highly concentrated regions being at least ten times higher in concentration than said first conductivity type semiconductor substrate, said highly concentrated region at said bit line region being deeper in said substrate than said highly concentrated region at said storage region and thinner at the side interface with said bit line region than at the bottom thereof, said highly concentrated regions being formed by ion implantation in a direction perpendicular to the surface of said substrate.

2. A semiconductor memory device in accordance with claim 1, wherein said highly concentrated regions are within a concentration range of $10^{14}$ to $10^{18}/cm^3$ and said semiconductor substrate is within a concentration range of $10^{13}$ to $10^{16}/cm^3$.

* * * * *